United States Patent
Hooper et al.

(10) Patent No.: US 8,359,927 B2
(45) Date of Patent: Jan. 29, 2013

(54) MOLDED DIFFERENTIAL PRT PRESSURE SENSOR

(75) Inventors: Stephen R. Hooper, Mesa, AZ (US); James D. MacDonald, Chandler, AZ (US); William G. McDonald, Payson, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 760 days.

(21) Appl. No.: 12/539,853

(22) Filed: Aug. 12, 2009

(65) Prior Publication Data

US 2011/0036174 A1  Feb. 17, 2011

(51) Int. Cl.
*G01L 9/06* (2006.01)

(52) U.S. Cl. ............... 73/721; 73/715; 73/716; 73/727; 73/736

(58) Field of Classification Search .............. None
See application file for complete search history.

(56) References Cited

U.S. PATENT DOCUMENTS

| | | | |
|---|---|---|---|
| 5,391,039 A * | 2/1995 | Holtom | 414/408 |
| 5,395,800 A * | 3/1995 | Maruyama | 29/827 |
| 5,523,617 A * | 6/1996 | Asanasavest | 257/666 |
| 5,663,506 A * | 9/1997 | Moore et al. | 73/708 |
| 5,918,112 A * | 6/1999 | Shah et al. | 438/107 |
| 6,148,673 A * | 11/2000 | Brown | 73/721 |
| 6,401,545 B1 * | 6/2002 | Monk et al. | 73/756 |
| 6,602,735 B2 * | 8/2003 | Shyu | 438/111 |
| 6,683,370 B1 * | 1/2004 | McDonald et al. | 257/676 |
| 6,688,182 B2 * | 2/2004 | Kurtz et al. | 73/727 |
| 6,769,319 B2 * | 8/2004 | McDonald et al. | 73/866.1 |
| 6,813,956 B2 * | 11/2004 | Kurtz et al. | 73/754 |
| 6,891,239 B2 * | 5/2005 | Anderson et al. | 257/414 |
| 7,437,951 B2 | 10/2008 | McDonald et al. | |
| 7,584,665 B2 * | 9/2009 | Kurtz et al. | 73/721 |
| 7,762,141 B2 * | 7/2010 | Tanaka et al. | 73/725 |
| 7,952,154 B2 * | 5/2011 | Guo et al. | 257/417 |
| 8,074,521 B2 * | 12/2011 | Kurtz et al. | 73/716 |
| 2009/0130780 A1 | 5/2009 | Day et al. | |

FOREIGN PATENT DOCUMENTS

| | | |
|---|---|---|
| EP | 1719993 A1 | 8/2006 |
| WO | WO 2007/111611 A1 | 1/2007 |
| WO | WO 2008/089969 A2 | 7/2008 |

OTHER PUBLICATIONS

M. Shaw et al., Package Design of Pressure Sensors for High Volume Consumer Applications, 58th Electronic Components and Technology Conference, May 27-30, 2008.
S. Hooper et al., U.S. Appl. No. 12/368,402, filed Feb. 10, 2009, entitled Exposed Pad Backside Pressure Sensor Package.

* cited by examiner

*Primary Examiner* — Lisa Caputo
*Assistant Examiner* — Jermaine Jenkins
(74) *Attorney, Agent, or Firm* — Hamilton & Terrile, LLP; Michael Rocco Cannatti

(57) ABSTRACT

A method and apparatus are described for fabricating an exposed differential pressure sensor (30) which protects interior electrical components (37) formed on a topside surface of a differential pressure sensor transducer die (31) from corrosive particles using a molding compound (39), but which vents both sides of a piezoresistive transducer sensor diaphragm (33) through a first vent hole (42) formed in an exposed die flag (36) and a second vent hole (38) formed in an exposed cap structure (33), enabling the sensor diaphragm (33) to sense differential pressure variations directly or indirectly through a protective gel.

20 Claims, 5 Drawing Sheets

MOLDED DIFFERENTIAL PRT PRESSURE SENSOR

BACKGROUND OF THE INVENTION

1. Field of the Invention

The present invention is directed in general to the field of pressure sensor devices. In one aspect, the present invention relates to a micro-electro mechanical system (MEMS) pressure sensor having an improved packaging scheme for producing low cost differential pressure systems.

2. Description of the Related Art

Micro-Electro-Mechanical Systems (MEMS) technology is increasingly used to integrate mechanical elements, sensors, actuators, and electronics on a common silicon substrate through microfabrication technology. For example, MEMS pressure sensors can be used in a wide range of applications, including industrial applications such as air conditioning, liquid level sensing and flow control. Depending on the nature of the application, two types of pressure sensors are commonly used: absolute pressure sensors and differential pressure sensors. An absolute pressure sensor is a sensor that has an electrical output related to the absolute pressure of an external environment with respect to a known, constant pressure. A differential pressure sensor, on the other hand, is a sensor whose electrical output is related to a difference in pressures between two regions, and typically includes a semiconductor membrane separating two ports coupled to two different pressure levels. While differential pressure sensors may advantageously be used with differential circuits to provide higher linearity and greater noise immunity than the single-ended circuits typically used with absolute pressure sensors, there are significant technical challenges to using differential pressure sensors since one or both sides of the differential pressure sensor might be in close proximity to water or other corrosive chemicals. To protect against the corrosive environment, pressure sensors are provided with various coatings, encapsulants, or diaphragms made from various elastic gels, polymers, or other materials, but these protection schemes add to the complexity of manufacturing such sensors, resulting in increased cost, reduced reliability, and/or reduced ability to measure the pressure (e.g., due to the presence of a thick coating on the sensing diaphragm).

Accordingly, a need exists for an improved differential pressure sensor device and manufacture method which overcomes the problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
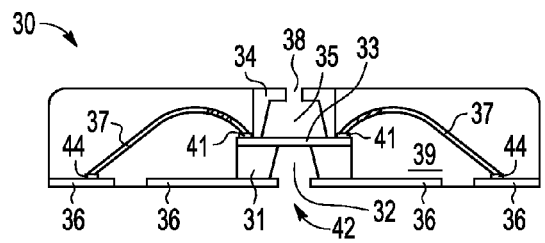
FIG. 1 illustrates a side view of a differential sensor package with the backside of the pressure sensor exposed through an opening in the exposed flag, and with a the topside of the pressure sensor exposed through a cap vent hole in accordance with selected embodiments of the present invention.

A method and apparatus are described for fabricating and packaging an integrated silicon differential pressure sensor having a backside piezoresistive transducer (PRT) that is directly exposed to the environment through a bottom vent hole formed in the exposed die pad, and also having a topside of the differential PRT sensor exposed through a cap vent hole. In selected embodiments, a backside of the differential PRT die is attached to an exposed flag on a lead frame so that the differential pressure sensor diaphragm on the back of the PRT die is directly vented to the environment through a vent hole in the exposed flag. By virtue of forming the differential pressure sensor diaphragm on the monocrystalline silicon backside of the PRT die, there is no need to form a protective film or gel over the differential pressure sensor diaphragm since the monocrystalline silicon on the backside is a relatively robust material. In addition, the differential pressure sensor diaphragm on the top of the PRT is vented through a small top vent hole in the silicon cap that is mounted over the top of the differential PRT die using any desired attachment or bonding mechanism, such as glass frit, epoxy or the like. The top vent hole allows pressure to flow in from the top, creating a differential pressure sensor arrangement. In selected embodiments, the relatively sensitive circuitry (e.g., the metal lines, etc.) is formed on the top of the differential PRT die so as to be protected from the environment by the molding encapsulant. The use of an exposed flag and vent hole and silicon cap vent hole eliminates the need for using core pins during molding to expose the sensor, thereby reducing the likelihood of cracking the differential PRT sensor during fabrication. By exposing both the top and bottom sides of the differential PRT sensor via top and bottom vent hole openings and then packaging the sensor between the exposed die flag and the molding compound, any desired packaging scheme may be used, including but not limited to QFN (Quad Flat No leads), LGA (Land Grid Array), SOIC (Small-Outline Integrated Circuit), or QFP (Quad Flat Package) packaging. With the disclosed invention, reliability is improved by covering all connections with the molding encapsulant, while sensing accuracy is improved by keeping both vent holes clear from molding compound. In addition, a smaller form factor may be obtained since there is no cavity required and since the molding encapsulant can be thinner when leaving the silicon cap exposed, and the additional cost and processing complexity for adding a gel coating can be avoided.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of an integrated silicon differential pressure sensor and associated packaging without including every device feature or geometry in order to avoid limiting or obscuring the present invention. In addition, certain elements in the figures are illustrated for simplicity and clarity and have not necessarily been drawn to scale. It is also noted that, throughout this detailed description, certain layers of materials will be deposited, removed and otherwise processed to form the depicted integrated silicon pressure sensor die and associated packaging structures. Where the specific procedures for forming such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

Referring now to FIG. 1, there is shown a side view of a differential sensor package 30 with the backside of the pressure sensor diaphragm 33 exposed through a first opening 42 in the exposed flag 36, and with the topside of the pressure sensor diaphragm 33 exposed through a cap vent hole 38 in accordance with selected embodiments of the present invention. The differential pressure sensor 33 may be implemented as a MEMS piezoresistive transducer (PRT) element by affixing a substrate structure 31 to a cap structure 34. Though shown as a simplified cross-section, it will be appreciated that wafer fabrication techniques may be used to form the substrate structure 31 from a monocrystalline silicon substrate material having first and second surfaces. On the first surface of the substrate structure 31 (shown as the "topside" or upper surface in FIG. 1), a resistive-type sensor circuit is formed, such as by forming semiconductor features (e.g., circuit elements) and metal connection lines into a Wheatstone bridge configuration (not shown) which is generally understood to refer to an electrical bridge consisting of two voltage divider branches connected in parallel with the same power supply. Persons having ordinary skill in the art will appreciate that the resistive-type sensor circuit may be formed on the first surface of the substrate structure 31 using any desired processing techniques, including but not limited to depositing, growing, masking, patterning, implanting, and/or etching various semiconductive, insulative, and/or conductive materials. On the second surface of the substrate structure 31 (shown as the "backside" or lower surface in FIG. 1), an opening 32 is formed in the monocrystalline silicon substrate using any desired selective etching technique, such as applying a reactive ion etch process to a patterned etch mask formed on the second surface. The selective etch process is controlled so that the opening 32 defines a sensing membrane or diaphragm 33 on which the sensor circuit is formed to detect differential pressure-induced stress variations.

Wafer fabrication techniques may also be used to form the cap structure 34 from a monocrystalline silicon substrate material, in which case the interior cavity opening 35 is formed using any desired selective etching technique. In addition, a small hole 38 is formed in the top of the silicon cap structure 34 to allow pressure to flow in from the top to create a differential pressure sensor 33. As will be appreciated, the cap structure 34 and associated vent hole 38 can be formed using film-assisted molding, in which case pre-taping may be applied to cover the top of the cap structure 34 and vent hole 38 during subsequent encapsulation molding to keep the top of the cap structure 34 and vent hole 38 exposed. Alternatively, the cap structure 34 and associated vent hole 38 can be formed with conventional silicone insert molding techniques where elastomer plugs are used to shut off either pressure port during molding. Of course, a combination of silicone inserts and tape might also be used.

When the substrate structure 31 and cap structure 34 are formed separately, they can be attached or bonded together using any desired attachment technique, including but not limited to glass frit, direct bonding, epoxy, fusion bonding, or solvent bonding. For example, bonding can be done at the wafer level by screen printing. At the assembly level, a cap structure 34 can be placed over the substrate structure 31 using an appropriate bonding material. In this case, the cap structure 34 does not have to be silicon, but can be any material that has suitable mechanical and thermal properties which do not adversely affect the performance of the sensor. In yet other embodiments, the substrate structure 31 and cap structure 34 may be attached together at the wafer level with an appropriate wafer bonding material, in which case the wafer for the cap structure 34 must be selectively processed to expose the portion of the substrate structure 31 where the bond pads are located for connection to the electrical wires 37. In selected embodiments, the cap structure 34 wafer structure is processed with a "saw-to-reveal" technique whereby parts of the wafer structure which contains the cap structure 34 are cut away to reveal the bond pad areas on the underlying substrate structure 31. With the "saw-to-reveal" technique, the cutting edge of the saw cuts through the cap structure 34 wafer structure to expose the bond pad areas on the substrate structure, thereby creating the vertical sidewalls shown in the cap structure 34.

Once the substrate structure die 31 and cap structure die 34 are affixed together into a differential sensor assembly, the assembly is mounted or affixed to the exposed die flag portion of the electrical leads 36 so that the opening 32 in the backside of the substrate structure 31 is aligned with an opening or vent hole 42 in the exposed die flag. Again, any desired technique may be used to affix the sensor assembly 31, 34 to the exposed die flag, such as, for example, using a die bonding adhesive material or layer (not shown). The sensor assembly 31, 34 is then electrically connected to adjacent electrical leads 36, such as by thermosonically bonding electrical wires 37 between bond pads 44 on the electrical leads 36 and the bond pads 41 on the substrate structure 31. Thus formed, the resistive-type sensor circuit detects deflections in the membrane 33 caused by differential changes in the pressure in the opening 32 as compared to the pressure in opening 35. At this point in the fabrication process, a protective gel (not shown) may be dispensed to such a thickness that it covers at least the top of the substrate structure die 31, the bond pads 41 on the substrate structure 31, and at least part of the electrical wires 37. The protective gel forms a protective barrier against any corrosive particulates or fluids, and also provides stress relief from the subsequently formed molding compound.

As further illustrated in FIG. 1, the sensor assembly 31, 34, bond pads 41, 44, electrical wires 37, and electrical leads 36 are encapsulated with an insulating package body or molding 39 so as to leave exposed the lower surface of the die flag 36 and the upper surface of the cap structure 34. The molding 39 may be formed by transfer molding, compression molding, injection molding, or otherwise forming an encapsulant to seal and protect the sensor circuitry on the "topside" of the substrate structure 31 from moisture, contamination, corrosion, and mechanical shock, but without covering or sealing the vent hole opening 42 in the exposed die flag portion of the electrical leads 36 or the cap vent hole opening 38 in the exposed cap structure 34. For example, after affixing and electrically connecting the sensor assembly 31, 34 to the electrical leads 36, an encapsulation process is performed to cover the sensor assembly 31, 34 with a mold compound or mold encapsulant that leaves exposed the bottom vent hole 42 formed in the exposed die pad 36 and cap vent hole 38 formed in the cap structure 34. The mold encapsulant may be a silica-filled resin, a ceramic, a halide-free material, or some other protective encapsulant layer. The mold encapsulant is typically formed by molding thermosetting materials in a process where a plastic is softened by heat and pressure in a transfer chamber, then forced at high pressure through suitable sprues, runners, and gates into a closed mold for final curing. The mold encapsulant may also be formed by using a liquid which is then heated to form a solid by curing in a UV or ambient atmosphere, or by using a solid that is heated to form a liquid and then cooled to form a solid mold. As will be appreciated, any desired encapsulant process may be used to protect the sensor assembly 31, 34 from the environment, provided that the vent hole opening 42 and cap vent hole 38 remain open. This may be accomplished by forming the molding compound 39 to be flush with the exposed die flag portion of the electrical leads 36 and the top of the cap structure 34 so that none of the molding compound 39 fills the openings 32, 35 or vent holes 38, 42.

Figure 2:
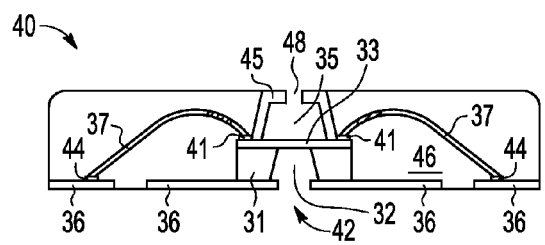
FIG. 2 illustrates a side view of a differential sensor package with exposed topside and backside in accordance with selected embodiments of the present invention.

While the sensor assembly 31, 34 may be formed using the "saw-to-reveal" technique described hereinabove, there are other techniques for fabricating the sensor assembly 31, 34. For example, the substrate structure 31 and cap structure 34 may be attached together at the wafer level with an appropriate wafer bonding material and then selectively processed by applying a bulk etch process to selectively etch the cap structure 34 wafer structure to reveal the bond pad areas on the underlying substrate structure 31. An example embodiment is shown in FIG. 2 which illustrates a side view of a differential sensor package 40 where the backside of the pressure sensor diaphragm 33 is exposed through a first opening 42 in the exposed flag 36, and where the topside of the pressure sensor diaphragm 33 exposed through a cap vent hole 48. As described above with reference to FIG. 1, the backside pressure sensor 33 may be implemented as a MEMS piezoresistive transducer (PRT) element by affixing a substrate structure 31 to a cap structure 45, mounting the backside of the resulting sensor assembly 31, 45 to the exposed die flag portion of the electrical leads 36 to align the opening 32 and vent hole 42. However, instead of using the "saw-to-reveal" technique, the cap structure 45 wafer structure is selectively etched with any desired bulk etch process to expose the bond pad areas on the underlying substrate structure 31. With the "bulk etch" technique, the selected etch chemistry or process etches through the cap structure 45 wafer structure to expose the bond pad areas on the substrate structure, thereby creating the slanted sidewalls shown in the cap structure 45 in FIG. 2. With these bond areas exposed, the electrical wires 37 may be thermosonically bonded between the bond pads 44 of the electrical leads 36 and the bond pads 41 on the substrate structure 31. Finally, the insulating package body or molding compound 46 is formed directly on the sensor assembly 31, 45 and electrical wires 37 by transfer molding, compression molding, injection molding, or otherwise. This process still forms an encapsulant to seal and protect the sensor circuitry on the substrate structure 31 from moisture, contamination, corrosion, and mechanical shock, but without covering or sealing the bottom vent hole opening 42 in the exposed die flag portion of the electrical leads 36 or the top cap vent hole 48 formed in the cap structure 45.

Figure 3:
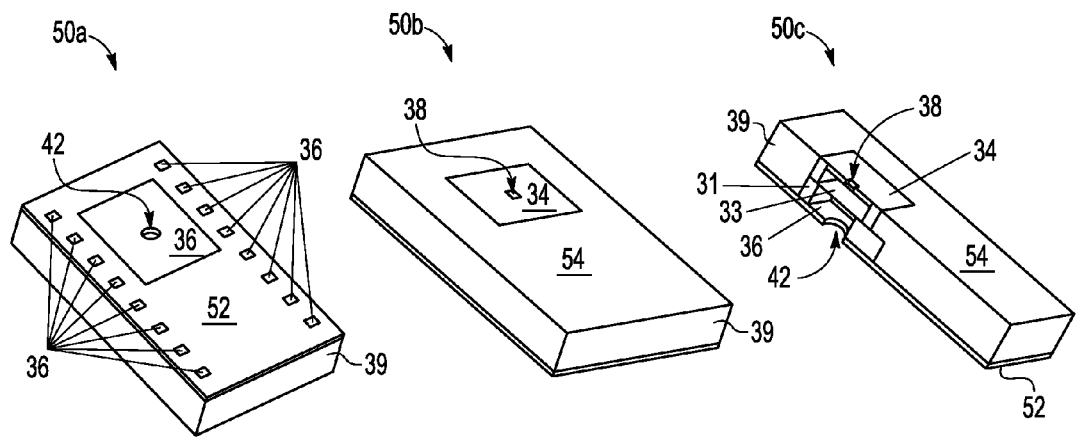
FIG. 3 illustrates isometric top and bottom views of the differential pressure sensor package shown in FIG. 1 or 2.

FIG. 3 illustrates isometric top and bottom views of the differential pressure sensor package 50 shown in FIG. 1, including a cut-away top view of the differential pressure sensor package. As depicted with the bottom view 50a, the differential sensor package 50 includes an exposed cap structure 34 in which is formed an opening or vent hole 42 that is centered in the exposed die flag portion. The exposed die flag portion is flush with and sealed against the bottom surface 52 of the insulating package body or molding 39, thereby leaving the vent hole 42 clear but otherwise protecting the underlying electrical leads, bond pads and wires from corrosive particles or fluids. It should be noted that the vent hole 42 allows communication of pressure through the opening 32 and directly to the sensor membrane or diaphragm 33. However, because the resistive-type sensor circuit is formed on the opposite surface of the substrate structure 31, the vent hole 42 does not expose the semiconductor or metal components of the resistive-type sensor circuit to corrosion. Referring now to the top view 50b, the differential sensor package 50 includes an exposed top surface of the cap structure 34 in which is formed an opening or vent hole 38. The exposed surface of the cap structure 34 is flush with and sealed against the top surface 54 of the insulating package body or molding 39, thereby leaving the vent hole 38 clear. As shown with the cut-away top view 50c of the differential pressure sensor package, the encapsulant molding 39 shields the sensitive components of differential pressure sensor assembly 31, 34 from corrosive elements while allowing the sensor membrane or diaphragm 33 to have unfettered access to external pressure conditions through the vent hole opening 42 in the exposed die flag portion of the electrical leads 36 and the cap vent hole opening 38.

Figure 4:
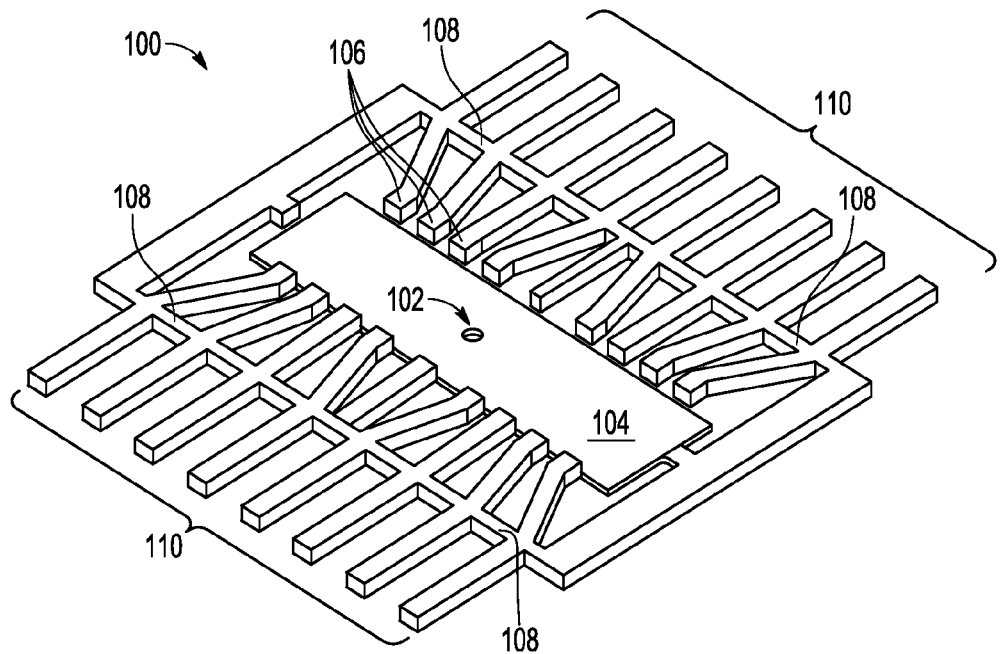
FIG. 4 is an isometric top view of an example lead frame having a vent hole formed in the die flag that is suitable for use in conjunction with selected embodiments of the present invention.

To illustrate an example fabrication sequence for packaging an integrated silicon pressure sensor having a backside PRT sensor, reference is now made to FIG. 4 which provides an isometric top view of an example lead frame 100 having a vent hole 102 formed in the die flag 104 that is suitable for use in conjunction with selected embodiments of the present invention. As will be appreciated, the lead frame 100 and vent hole 102 may be produced by stamping or etching a portion of a metal (e.g., copper or copper alloy) strip with a predetermined pattern of lead frame features (e.g., die attach flags, interior electrical contacts, exterior electrical contacts, etc.). In selected embodiments, the exposed die flag 104 of the copper lead frame may be plated on at least the exterior surface (e.g. with NiPdAu). The depicted lead frame 100 includes a plurality of interior electrical contacts 106 and a plurality of exterior electrical contacts 110 that are connected to a dam bar 108 which is provided around the perimeter of lead frame 100. As will be appreciated, the dam bar 108 is later removed (i.e., trimmed) from lead frame 100 during device processing to physically separate and electrically isolate adjacent ones of contacts 102 and 110. The depicted lead frame 100 also includes a die attach flag 104 that is connected to the dam bar 108. As shown, the die attach flag 104 is recessed below the remainder of the lead frame so that die flag remains exposed even after the remainder of the lead frame 100 is encapsulated.

Figure 5:
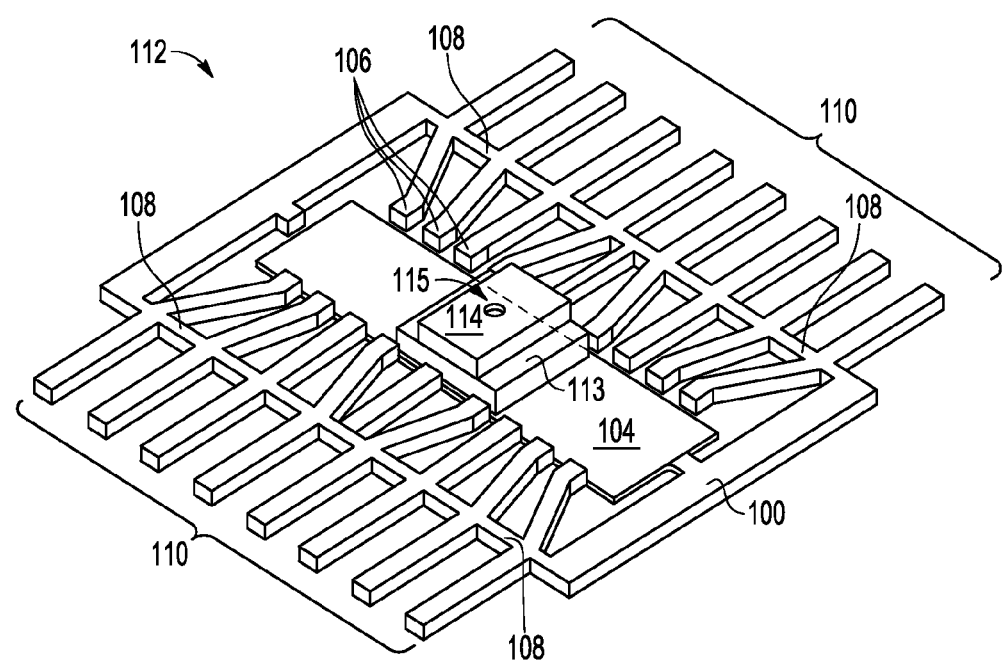
FIG. 5 is an isometric top view of a lead frame assembly having a backside piezoresistive transducer (PRT) die mounted in alignment with the vent hole in the die flag, where the transducer die is formed with a silicon cap having a top vent hole to allow pressure to flow in from the top creating a differential pressure sensor.
Figure 6:
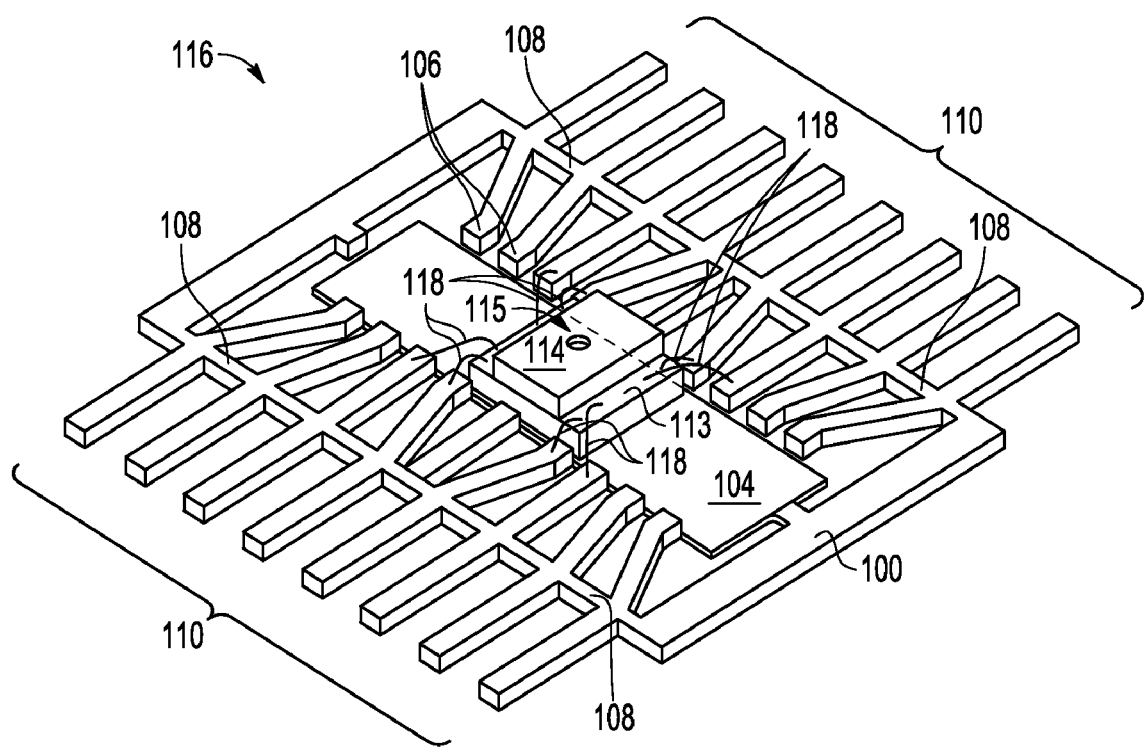
FIG. 6 is an isometric top view of the lead frame assembly after wirebond connections are made between the transducer die and the lead frame.

The die attach flag 104 is configured to support an integrated circuit (IC) die or device, such as an application specific integrated circuit (ASIC). In particular and as shown in FIG. 5 with the isometric top view of a lead frame assembly 112, a backside piezoresistive transducer (PRT) die 113 is mounted in alignment with the vent hole 102 in the die flag 104. Though not shown explicitly in FIG. 5, the backside PRT die 114 includes a differential sensor membrane or diaphragm which is exposed through a bottomside opening or cavity to the vent hole 102 in the die flag 104. The PRT die 113 also includes a topside surface on which the sensor circuitry and bond pads (not shown) are formed. The lead frame assembly 112 also includes a cap structure or die 114 that is mounted in alignment with the backside PRT die 113. As formed, the cap structure or die 114 includes a bottomside opening or cavity which is aligned with the differential sensor membrane or diaphragm, and also includes a cap vent hole 115 for venting to an external pressure source. Together the backside PRT die 113 and cap structure/die 114 are assembled or attached into a differential sensor assembly 113, 114, and conventional die bonding may be used to secure the backside PRT die 113 to the die attach flag 104 with a suitable bonding material (e.g., epoxy, glass, gold preform, solder paste, etc.). After being secured to flag 104, the backside PRT die 113 is wire bonded to a selected group of interior electrical contacts 106 with, for example, segments of gold wire as shown in FIG. 6 which illustrates an isometric top view of the lead frame assembly 116 after wirebond connections 118 are made between the backside PRT die 113 and the interior electrical contacts 106. By positioning and affixing the backside PRT die 113 in alignment with the vent hole 102 in the die flag 104, the pressure sensor membrane is vented directly to a first pressure source in the external environment.

Figure 7:
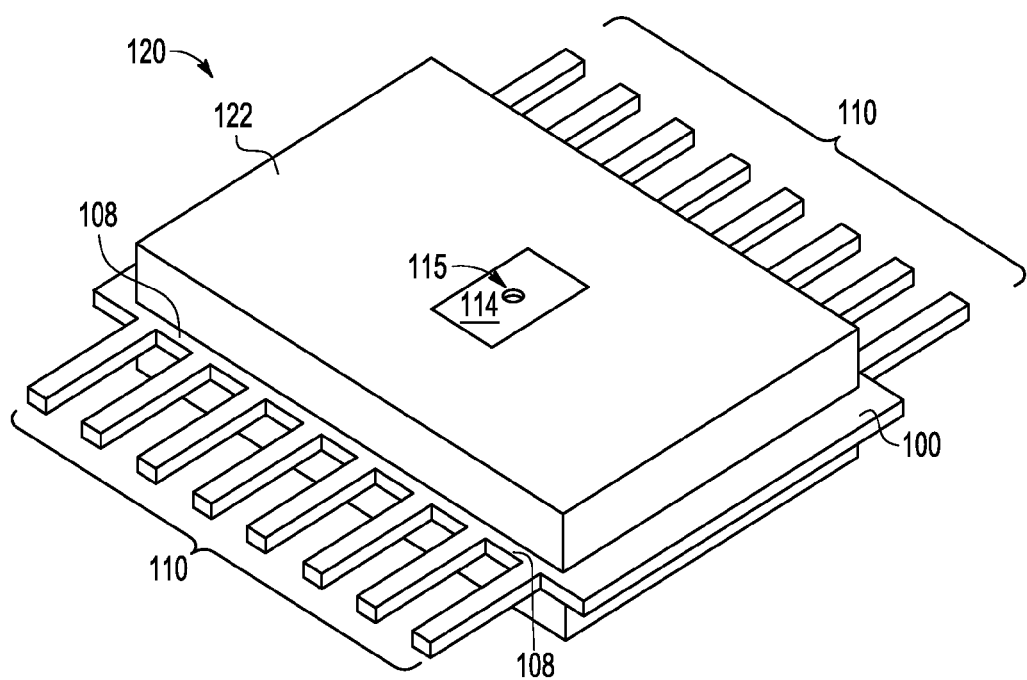
FIG. 7 is an isometric top view of an encapsulated device in which the transducer die and lead frame are encapsulated with a molding compound, showing the differential pressure sensor exposed to the environment through the top vent hole in the silicon cap.
Figure 8:
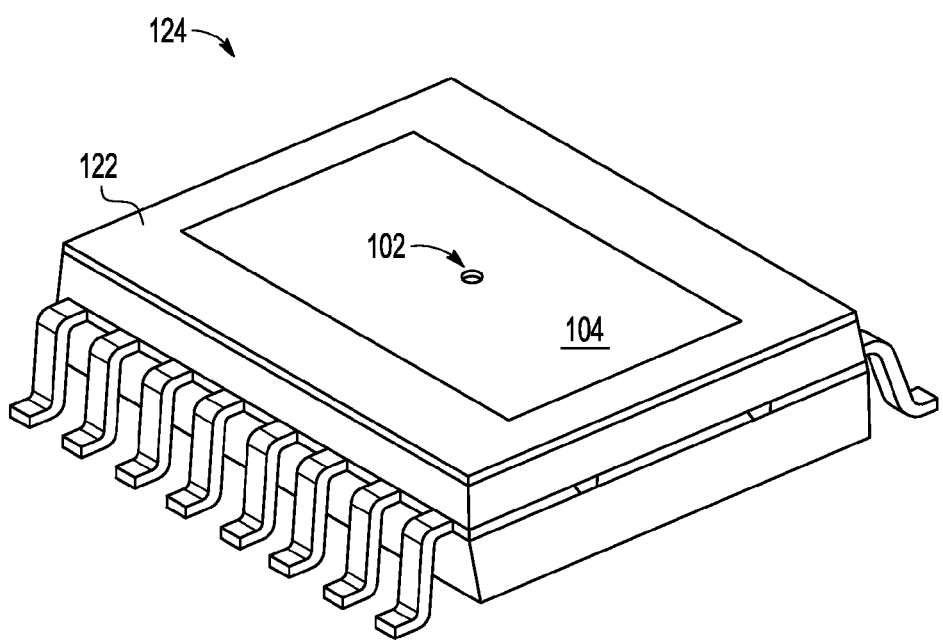
FIG. 8 is an isometric bottom view of an encapsulated device showing differential pressure sensor exposed the environment through the vent hole in the die flag.

Turning now to FIG. 7, there is illustrated processing of the packaged differential sensor subsequent to FIG. 6 with an isometric top view of an encapsulated device 120 in which the differential sensor assembly 113, 114 and lead frame 100 are encapsulated with a molding compound 122. In particular, after the backside PRT die 114 has been die bonded to flag 104 and wire bonded to selected ones of interior electrical contacts 106, a portion of lead frame 100 may then be overmolded or transfer molded with a composite material (e.g., plastic) to create a molded body 122. In the depicted view, the pressure sensor membrane (not shown) in the differential sensor assembly 113, 114 is vented directly to a second pressure source in the external environment through the top vent hole 115 in the silicon cap 114. Thus, the top of the die 114 and the bottom of the exposed flag 104 will not be covered by the molding compound 122, thereby leaving the pressure sensor membrane on the backside PRT die exposed to the environment through the vent hole 102 in the die flag 104 and through the top vent hole 115 in the cap structure 114. This arrangement is depicted in FIG. 8 which illustrates processing of the packaged differential pressure sensor assembly 113, 114 subsequent to FIG. 7 with an isometric bottom view of the encapsulated device 124. As shown in FIG. 8, the molding compound 122 is formed to be flush with the exposed die flag 104, the exterior electrical contacts 110 have been bent, and the dam bar 108 has been trimmed. Because the vent hole 102 in the die flag 104 is not covered or blocked by the molding compound 122, the pressure sensor on the backside PRT die 113 is vented directly to the environment. While the formation of the molding encapsulation compound 122 to leave exposed the vent holes 102, 115 is well suited for lead frame packaging schemes, such as QFN (Quad Flat No leads), SOIC (Small-Outline Integrated Circuit), or LGA (Land Grid Array) packaging, it will be appreciated that other substrate packaging schemes could be used, such as QFP (Quad Flat Package).

Figure 9:
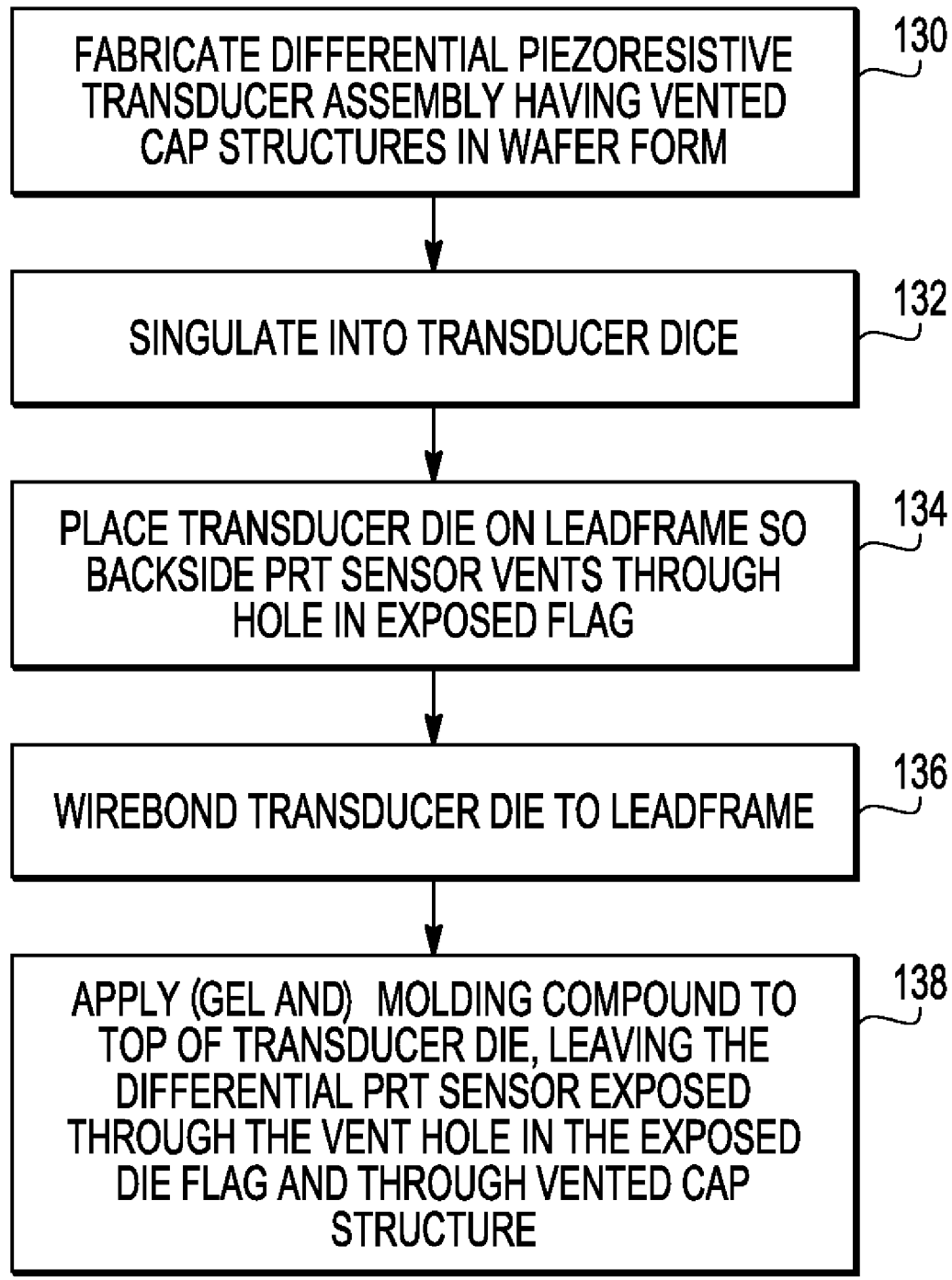
FIG. 9 illustrates an example flow chart depicting a process of fabricating a differential pressure sensor package in accordance with selected embodiments of the present invention.

FIG. 9 illustrates an example flow chart depicting a process of fabricating a differential pressure sensor package in accordance with selected embodiments of the present invention. The process begins at step 130 with the fabrication of the differential piezoresistive transducer assembly having vented cap structures in wafer form using any desired semiconductor fabrication sequence. At a minimum, the differential piezoresistive transducer wafer is formed to include sensor circuitry and sensitive metal connection lines (e.g., contact pads) on a topside surface, and to include a single crystal semiconductor layer on a backside surface in which one or more openings are formed to define a single crystal sensor diaphragm which does not require a protective film. In addition, a cap wafer is also formed to include a semiconductor layer in which one or more openings or cavities are formed in alignment with the sensor diaphragms on the differential PRT die, where each opening or cavity includes a vent hole that may be formed by any number of possible processes. The differential PRT wafer may be bonded to the cap wafer using any desired attachment mechanism (including but not limited to glass frit, direct bonding, epoxy, fusion bonding, or solvent bonding), and the underlying differential PRT wafer may then be exposed by applying bulk etch processes (to etch the silicon cap wafer) or saw-to-reveal processes (to remove a portion of the cap wafer).

At step 132, the transducer wafer is singulated into one or more transducer dice. For example, the transducer wafer may be singulated into one or more substrate structure dice, and the cap wafer may be singulated into one or more cap structure dice. In selected embodiments, the singulation process is controlled so that the size of each cap structure die is smaller than the substrate structure die, thereby allowing the cap structure die to be affixed to the substrate structure die without covering the contact pads on the topside surface of the substrate structure die.

At step 134, each transducer die is placed on a lead frame structure which includes a die flag having a vent hole formed therein, thereby forming a sensor assembly. The die flag may be recessed in relation to the remainder of the lead frame structure so that, when finally encapsulated, the die flag is exposed or flush with the exterior surface of the mold encapsulant. Alternatively, the die flag may be even with the remainder of the lead frame structure so that, when finally encapsulated, the die flag is exposed and remaining deal frame structure is flush with the exterior surface of the mold encapsulant. At this step, the transducer die is aligned with the vent hole so that the backside PRT sensor in the transducer die can vent through the vent hole in the die flag.

At step 136, the transducer die is electrically connected to the internal lead frame elements, such as by using a wirebonding process to connect the bond pads of the sensor assembly to the internal electrical leads in the lead frame. In selected embodiments, the electrical bond wires are thermosonically bonded to the internal electrical leads and to the bond pads on the transducer die.

At step 138, a molding compound is applied to surround and protect the transducer die while leaving the differential PRT sensor exposed through the vent holes in the exposed flag and exposed cap structure. Prior to forming the molding compound, a protective gel layer may be formed (as parenthetically indicated) over the topside surface of the transducer die to protect the sensor circuitry, sensitive metal lines and bond wires, and diaphragm. However, the protective gel layer need not be formed over the backside sensor diaphragm since it is formed from a single crystal material that is not susceptible to corrosion. In addition, the protective gel layer need not be formed over the topside surface of the transducer die in selected embodiments, such as when the transducer die can tolerate the molding compound stress. In either case, the molding compound is formed to leave exposed the topside surface of the cap structure (and its cap vent hole), but to otherwise cover the electrical leads, bond pads, and bond wires at the topside surface of the transducer die, thereby preventing corrosive materials or fluids from reaching the sensitive portions of the transducer die. By keeping the differential sensor diaphragm and cap vent hole clear from molding compound, more accurate pressure readings can be made by the topside sensor diaphragm. Likewise, by keeping the differential sensor diaphragm and vent hole in the die flag clear from molding compound, more accurate pressure readings can be made by the bottomside sensor diaphragm.

By now, it should be appreciated that there has been provided herein a method for fabricating a packaged differential pressure sensor. The packaged differential sensor includes an exposed die flag in which a first vent hole, and a differential pressure sensor transducer die that is attached to the die flag. The differential pressure sensor transducer die includes a sensor diaphragm formed between a backside and topside of the differential pressure sensor transducer die, and also includes sensor circuitry formed on the topside of the differential pressure sensor transducer die. By affixing the backside of the differential pressure sensor transducer to the exposed die flag, a backside of the sensor diaphragm is directly vented to the environment through the first vent hole in the exposed die flag. A cap structure is attached to the topside of the differential pressure sensor transducer die (e.g., via die bonding), where the cap structure includes a second vent hole that is formed so that the topside of the sensor diaphragm is directly vented to the environment through the second vent hole in the cap structure. Electrical connectors are also included in the packaged differential pressure sensor for electrically coupling the sensor circuitry formed on the topside of the pressure sensor transducer die to the outside world. The electrical connectors may include one or more bond pads formed on the topside of the differential pressure sensor transducer die, a wire connector connected to each of the one or more bond pads, and a lead frame element connected to each wire connector, where the lead frame element extends through the molded body. Finally, the packaged differential pressure sensor includes a molded body that is formed at least partially around the electrical connectors and around the differential pressure sensor transducer die without covering the first vent hole in the exposed die flag or the second vent hole in the cap structure. In selected embodiments, the molded body is a QFN (Quad Flat No leads), SOIC (Small-Outline Integrated Circuit), QFP (Quad Flat Package), or LGA (Land Grid Array) packaging body. As formed, the molded body protects the sensor circuitry formed on the topside of the pressure sensor transducer die from corrosive external environmental conditions. To this end, the exposed die flag may be located in substantially the same plane as a plurality of lead frame elements forming at least part of the electrical connectors so that the exposed die flag and plurality of lead frame elements are exposed at a bottom surface of the molded body. Likewise, the cap structure may be formed with a top surface in which the second vent hole is formed so that the top surface and second vent hole are exposed at a top surface of the molded body.

In another form, there is provided a packaged exposed differential pressure sensor and associated method for fabricating same. In the disclosed methodology, a piezoresistive transducer die is provided having a differential sensor diaphragm which may be formed with a monocrystalline silicon substrate layer having a backside surface in which an opening is formed to define the differential sensor diaphragm. A cap structure having a first vent hole is attached to a topside of the piezoresistive transducer die so that the differential sensor diaphragm formed on the piezoresistive transducer die has a topside that is vented through the first vent hole in the cap structure. In addition, the PRT die is affixed to a die flag so that the differential sensor diaphragm formed on a backside of the PRT die is vented through a second vent hole formed in the die flag. This can be done by die bonding the backside of the PRT die to a lead frame which includes an exposed die flag that is in substantially the same plane as a plurality of lead frame elements so that the differential sensor diaphragm formed on the backside of the PRT die is aligned with the second vent hole formed in the exposed die flag and so that the bottom surface of the molded body is flush with the plurality of lead frame elements and the exposed die flag in which the second vent hole is formed. After fixing the PRT die to the die flag, circuitry formed on the topside of the PRT die is electrically connected to one or more electrical connectors. In selected embodiments, electrical connections are made by wire coupling (e.g., thermosonically bonding) wire connectors between one or more bond pads formed on the topside of the PRT die and one or more lead frame electrical connectors. Once the electrical connections are made, a molded body is formed at least partially around the one or more electrical connectors and around the piezoresistive transducer die to cover at least the circuitry on the topside of the piezoresistive transducer die without covering the first vent hole in the cap structure or the second vent hole in the exposed die flag, where the molded body protects the circuitry formed on the topside of the PRT die from external environmental conditions. In selected embodiments, the molded body is formed by overmolding or transfer molding a composite material to cover at least the circuitry on the topside of the PRT die without covering the vent hole formed in the die flag or the second vent hole in the cap structure. Examples of molded bodies include a QFN (Quad Flat No leads), SOIC (Small-Outline Integrated Circuit), QFP (Quad Flat Package), or LGA (Land Grid Array) packaging body.

In yet another form, there is provided a packaged differential pressure sensor and method for making same. As disclosed, the packaged pressure sensor includes a piezoresistive transducer die having a differential sensor diaphragm with first and second sensor surfaces. The packaged differential pressure sensor also includes an exposed pad attached to the piezoresistive transducer die having a first vent hole formed in the exposed pad for venting the first sensor surface of the differential sensor diaphragm to a first external environment. A cap structure is attached to the piezoresistive transducer die and includes a second vent hole formed in the cap structure for venting the second sensor surface of the differential sensor diaphragm to a second external environment. The cap structure may be implemented as a silicon cap that is mounted to the piezoresistive transducer die with glass frit, direct bonding, epoxy, fusion bonding, or solvent bonding so that the second vent hole is aligned with the second sensor surface of the differential sensor diaphragm. A housing is formed to surround and protect the piezoresistive transducer die from corrosive external environmental conditions without covering the first and second vent holes, where the housing may be implemented as a QFN (Quad Flat No leads), SOIC (Small-Outline Integrated Circuit), QFP (Quad Flat Package), or LGA (Land Grid Array) packaging body. At least a first electrical connector protrudes through said housing that is electrically coupled to the piezoresistive transducer die, and may include one or more bond pads formed on the backside piezoresistive transducer die, a wire connector connected to each of the one or more bond pads, and a lead frame element connected to each wire connector, where the lead frame element extends through the housing.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. While the disclosed MEM devices may be implemented as a gyroscope, the fabrication process described herein is not limited to gyroscopes or any other type of sensor, but is also applicable to any one of numerous MEM devices that include some type of structure that is movably suspended by one or more springs and that is formed by bonding an active wafer to a reference wafer. Non-limiting examples of such devices include various types of accelerometers and switches, optical MEM system components, and other MEM system devices that use drive and sense electrodes. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the process steps may be performed in an alternative order than what is presented. For example, the sequence of wafer bonding steps may be reversed. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A packaged differential pressure sensor, comprising:
    an exposed die flag in which a first vent hole is formed;
    a differential pressure sensor transducer die comprising a sensor diaphragm located between a backside and topside of the differential pressure sensor transducer die and sensor circuitry located on the topside of the differential pressure sensor transducer die, where the backside of the differential pressure sensor transducer is affixed to the exposed die flag so that a backside of the sensor diaphragm is directly vented to the environment through the first vent hole in the exposed die flag;
    a cap structure in which a second vent hole is located, where the cap structure is attached to the topside of the differential pressure sensor transducer die and so that the topside of the sensor diaphragm is vented to the environment through the second vent hole in the cap structure;
    one or more electrical connectors that are electrically coupled to the sensor circuitry located on the topside of the differential pressure sensor transducer die; and
    a molded body formed at least partially around the electrical connectors and around the differential pressure sensor transducer die without covering the first vent hole in the exposed die flag or the second vent hole in the cap structure, where the molded body covers the sensor circuitry located on the topside of the differential pressure sensor transducer die.

2. The packaged differential pressure sensor of claim 1, where the cap structure is die bonded to the differential pressure sensor transducer die.

3. The packaged differential pressure sensor of claim 1, where the exposed die flag is in substantially the same plane as a plurality of lead frame elements forming at least part of the electrical connectors so that the exposed die flag and plurality of lead frame elements are exposed at a bottom surface of the molded body.

4. The packaged differential pressure sensor of claim 1, where the cap structure comprises a top surface in which the second vent hole is located, wherein the top surface of the cap structure and the second vent hole are exposed at a top surface of the molded body.

5. The packaged differential pressure sensor of claim 1, where the differential pressure sensor transducer die comprises a piezoresistive transducer die.

6. The packaged differential pressure sensor of claim 1, where the differential pressure sensor transducer die comprises a piezoresistive transducer die formed from a monocrystalline silicon substrate layer in which an opening is formed to define the sensor diaphragm.

7. The packaged differential pressure sensor of claim 1, where the one or more electrical connectors comprise:
    one or more bond pads located on the topside of the differential pressure sensor transducer die;
    a wire connector connected to each of the one or more bond pads; and
    a lead frame element connected to each wire connector, where the lead frame element extends through the molded body.

8. The packaged differential pressure sensor of claim 1, where the molded body comprises a QFN (Quad Flat No leads), SOIC (Small-Outline Integrated Circuit), QFP (Quad Flat Package), or LGA (Land Grid Array) packaging body.

9. A method for packaging an exposed differential pressure sensor, comprising:
    affixing a piezoresistive transducer die to a die flag so that a differential sensor diaphragm formed on the piezoresistive transducer die has a backside that is vented through a first vent hole formed in the die flag;
    attaching a cap structure having a second vent hole to a topside of the piezoresistive transducer die so that the differential sensor diaphragm formed on the piezoresistive transducer die has a topside that is vented through the second vent hole in the cap structure;

electrically connecting circuitry located on the topside of the piezoresistive transducer die to one or more electrical connectors; and forming a molded body at least partially around the one or more electrical connectors and around the piezoresistive transducer die to cover at least the circuitry on the topside of the piezoresistive transducer die without covering the first vent hole in the exposed die flag or the second vent hole in the cap structure.

10. The method of claim 9, where affixing the piezoresistive transducer die to the die flag comprises die bonding a backside of the piezoresistive transducer die to a lead frame so that the differential sensor diaphragm formed on the backside of the piezoresistive transducer die is aligned with the first vent hole formed in the die flag.

11. The method of claim 9, where affixing the piezoresistive transducer die to the die flag comprises attaching a backside of the piezoresistive transducer die to a lead frame comprising an exposed die flag that is in substantially the same plane as a plurality of lead frame elements forming at least part of the electrical connectors so that the exposed die flag and plurality of lead frame elements are exposed at a bottom surface of the molded body.

12. The method of claim 9, where the piezoresistive transducer die comprises a monocrystalline silicon substrate layer having a backside surface in which an opening is formed to define the backside of the differential sensor diaphragm.

13. The method of claim 9, where electrically connecting circuitry comprises wire coupling one or more bond pads located on the topside of the piezoresistive transducer die to one or more lead frame electrical connectors.

14. The method of claim 9, where electrically connecting circuitry comprises thermosonically bonding wire connectors to electrically connect one or more bond pads located on the topside of the piezoresistive transducer die to one or more lead frame electrical connectors.

15. The method of claim 9, where forming the molded body comprises overmolding or transfer molding a composite material to cover at least the circuitry on the topside of the piezoresistive transducer die without covering the first vent hole in the exposed die flag or the second vent hole in the cap structure.

16. The method of claim 9, where forming the molded body comprises forming a QFN (Quad Flat No leads), SOIC (Small-Outline Integrated Circuit), QFP (Quad Flat Package), or LGA (Land Grid Array) packaging body.

17. A packaged differential sensor, comprising:
a piezoresistive transducer die having a differential sensor diaphragm with first and second sensor surfaces;
an exposed pad attached to the piezoresistive transducer die having a first vent hole located in the exposed pad for venting the first sensor surface of the differential sensor diaphragm to a first external environment;
a cap structure attached to the piezoresistive transducer die having a second vent hole located in the cap structure for venting the second sensor surface of the differential sensor diaphragm to a second external environment;
a housing formed to surround and protect the piezoresistive transducer die without covering the first and second vent holes; and
at least a first electrical connector protruding through said housing that is electrically coupled to the piezoresistive transducer die.

18. The packaged differential pressure sensor of claim 17, where the first electrical connector comprises:
one or more bond pads located on the piezoresistive transducer die;
a wire connector connected to each of the one or more bond pads; and
a lead frame element connected to each wire connector, where the lead frame element extends through the housing.

19. The packaged differential pressure sensor of claim 17, where the housing comprises a QFN (Quad Flat No leads), SOIC (Small-Outline Integrated Circuit), QFP (Quad Flat Package), or LGA (Land Grid Array) packaging body.

20. The packaged differential pressure sensor of claim 17, where the cap structure comprises a silicon cap that is mounted to the piezoresistive transducer die with glass frit, direct bonding, epoxy, fusion bonding, or solvent bonding so that the second vent hole is aligned with the second sensor surface of the differential sensor diaphragm.

* * * * *